(12) United States Patent
Shubert et al.

(10) Patent No.: US 7,019,746 B2
(45) Date of Patent: Mar. 28, 2006

(54) GRAPHICAL PRESENTATION OF SPECTRAL INFORMATION FOR AID IN COMPLIANCE MEASUREMENTS

(75) Inventors: Karl Shubert, Healdsburg, CA (US); Randall King, Santa Rosa, CA (US); Stanley E. Jaffe, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 518 days.

(21) Appl. No.: 10/047,733

(22) Filed: Oct. 26, 2001

(65) Prior Publication Data

US 2003/0085897 A1 May 8, 2003

(51) Int. Cl.
*G06T 11/20* (2006.01)
(52) U.S. Cl. .................................. 345/440; 345/440.1
(58) Field of Classification Search ................ 345/440, 345/440.1, 440.2, 441, 442, 443; 445/423, 445/63.1
See application file for complete search history.

(56) References Cited

U.S. PATENT DOCUMENTS

| | | | | | |
|---|---|---|---|---|---|
| 4,631,533 | A | * | 12/1986 | Mark, Jr. .................. | 345/440.1 |
| 4,725,131 | A | * | 2/1988 | Goodwin et al. ............. | 385/46 |
| 4,812,996 | A | * | 3/1989 | Stubbs ........................ | 702/123 |
| 5,479,606 | A | * | 12/1995 | Gray .......................... | 345/501 |
| 5,684,508 | A | * | 11/1997 | Brilman .................... | 345/440.1 |
| 5,813,993 | A | * | 9/1998 | Kaplan et al. .............. | 600/544 |
| 5,821,537 | A | * | 10/1998 | Ishihara et al. ......... | 250/339.13 |
| 5,978,742 | A | * | 11/1999 | Pickerd ........................ | 702/66 |
| 6,131,013 | A | * | 10/2000 | Bergstrom et al. ......... | 455/63.1 |
| 6,232,952 | B1 | * | 5/2001 | Eglit .......................... | 345/661 |
| 6,577,964 | B1 | * | 6/2003 | LeCheminant et al. ....... | 702/69 |
| 6,785,540 | B1 | * | 8/2004 | Wichelman .................. | 455/423 |
| 6,882,217 | B1 | * | 4/2005 | Mueller .......................... | 330/2 |

* cited by examiner

*Primary Examiner*—Matthew Luu

(57) ABSTRACT

Multiple signals are graphically presented. A signal for each measured frequency channel is separately represented on a display. Representations of the signals are superimposed. Center channel frequencies for all the representations of the signals are aligned relative to a single position on a first axis. Amplitude for all the representations of the signals is indicated relative to a second axis. Overlap of a signal within a compliance mask indicates violation of an amplitude minimum, an amplitude maximum or frequency drift.

20 Claims, 8 Drawing Sheets

GRAPHICAL PRESENTATION OF SPECTRAL INFORMATION FOR AID IN COMPLIANCE MEASUREMENTS

RELATED APPLICATIONS

The subject matter set out in this patent application is related to application Ser. No. 09/777,780, filed Feb. 5, 2001.

BACKGROUND

The present invention concerns optical spectrum analysis and pertains particularly to the graphical presentation of spectral information for aid in compliance measurements.

Wavelength division multiplexing (WDM) fiber optic transmission systems currently utilize hundreds of laser signals to transmit information. Each laser signal resides within a specific frequency channel, defined by its center frequency and signal power. It is desirable to measure the frequency and power at various times in the manufacture, deployment and operation of a WDM system.

Channel analyzer instruments, such as optical spectrum analyzers and multiwavelength meters, can display a spectrum of WDM channels in a linear fashion across the instrument display. The horizontal (x) axis usually shows frequency; the vertical (y) axis power.

The user can "scan" the x-axis of the display to look at a particular signal, or set of signals. The user can also narrow the field of view and "zoom in" on specific wavelengths. Alternatively, a tabular listing of the wavelengths and the corresponding optical powers can be presented.

When there are few channels present, the user can see the spectral shape of individual signals. In this low-channel case, the user tabular results are less frequently used. As channel counts increase, the channels get compressed in the x-axis making it more difficult for the user to identify the spectral shape of the channels AND the user is forced to tediously scan and zoom-in to get spectral information on individual channels. In these high-channel count cases, the user tends to rely more on the tabular channel information and give up the visual information.

The tabular data is also becoming more difficult to navigate as it increases to multiple pages. The tabular data can be analyzed using an external computer to assess the performance of the individual laser signals relative to the channel center frequency, minimum and maximum power and frequency constraints. However, this is complicated because it requires the user to develop additional software.

SUMMARY OF THE INVENTION

In accordance with the preferred embodiment of the present invention, multiple signals are graphically presented. A signal for each measured frequency channel is separately represented on a display. Representations of the signals are superimposed. Center channel frequencies for all the representations of the signals are aligned relative to a single position on a first axis. Amplitude for all the representations of the signals is indicated relative to a second axis.

DESCRIPTION OF THE PREFERRED EMBODIMENT

Figure 1:
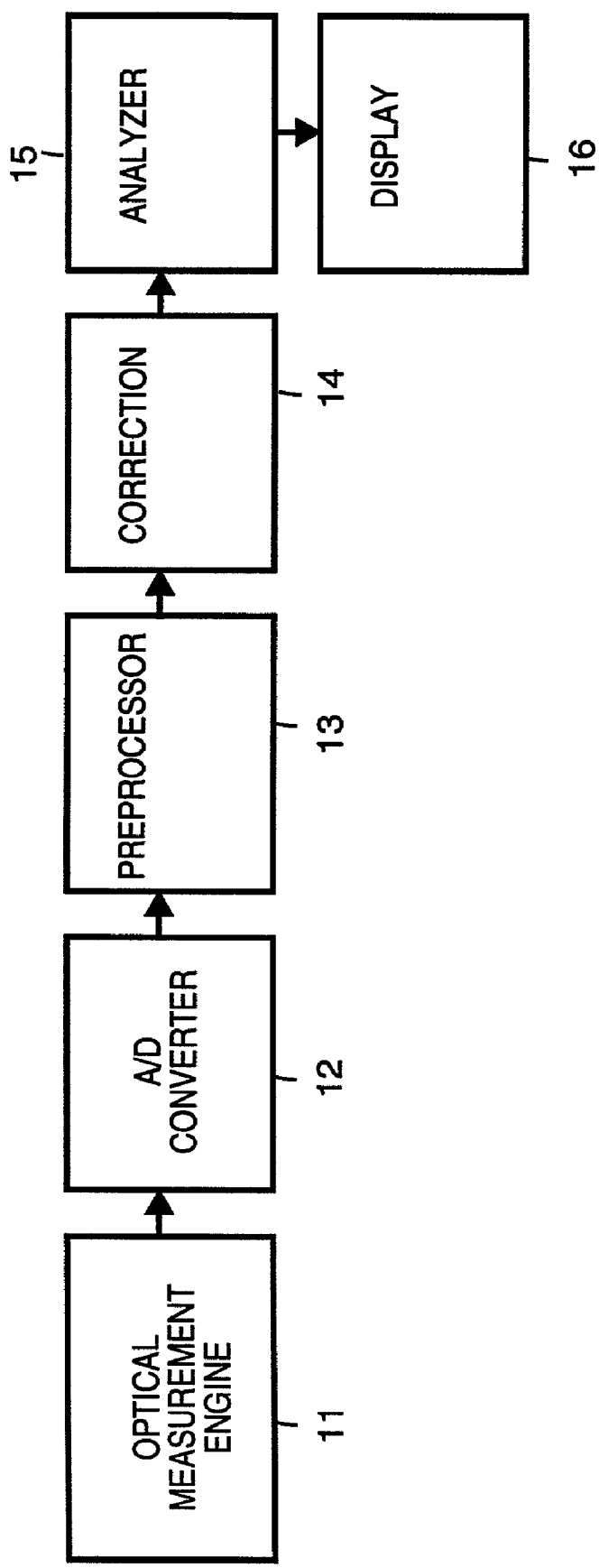
FIG. 1 is a simplified block diagram that illustrates operation of a channel analyzer instrument.

FIG. 1 is a simplified block diagram that illustrates operation of a channel analyzer. An optical measurement engine 11 includes a receive diode which generates analog signals forwarded to an analog-to-digital (A/D) converter 12. For example, optical measurement engine 11 is a Michelson interferometer. Alternatively, optical measurement engine 11 can be another type of optical measurement engine. A preprocessor 13 receives the analog data into a buffer. For example, the buffer is a memory that contains 256K words of data. The data is in the time domain. Preprocessor uses a Fast Fourier Transform (FFT) to generate data in the frequency domain. For example, a memory is used to store 128 K double words of frequency domain data. Each double word contains a value in complex (r+ji) format. After performing a filter function and a magnitude calculation to generate the 128 double/real elements. The resulting data is passed to a correction block 14.

While the measurement technology used to capture the signals in the disclosed embodiment is interferometric (Michelson), other methodologies can be used in different embodiments of the invention. For example, a Fabry-Perot interferometer, dispersive optics (used in optical spectrum analyzers) or other technology is used that can facilitate display of multiple channel information in WDM systems, Correction block 14 uses a correction table to correct nonlinearity in the receiving diode and to adjust diode gain as necessary to a lower gain in order to generate 128K corrected double/real elements. From these elements are derived an input array to analyzer block 15. From the input array, analyzer block 15 finds data for each channel, and stores the data for the channels in a channel repository. The channels are shown by a display 16, as part of a graphical user interface (GUI).

The preferred embodiment of the present invention simplifies the process of measuring multiple laser signals by allowing display of superimposed channels. Additionally, a mask can provide further information that allows a user to easily verify that each laser signal is within the prescribed frequency and powers. The user can set (or the instrument can set automatically) different bandwidths and powers for the mask.

Figure 2:
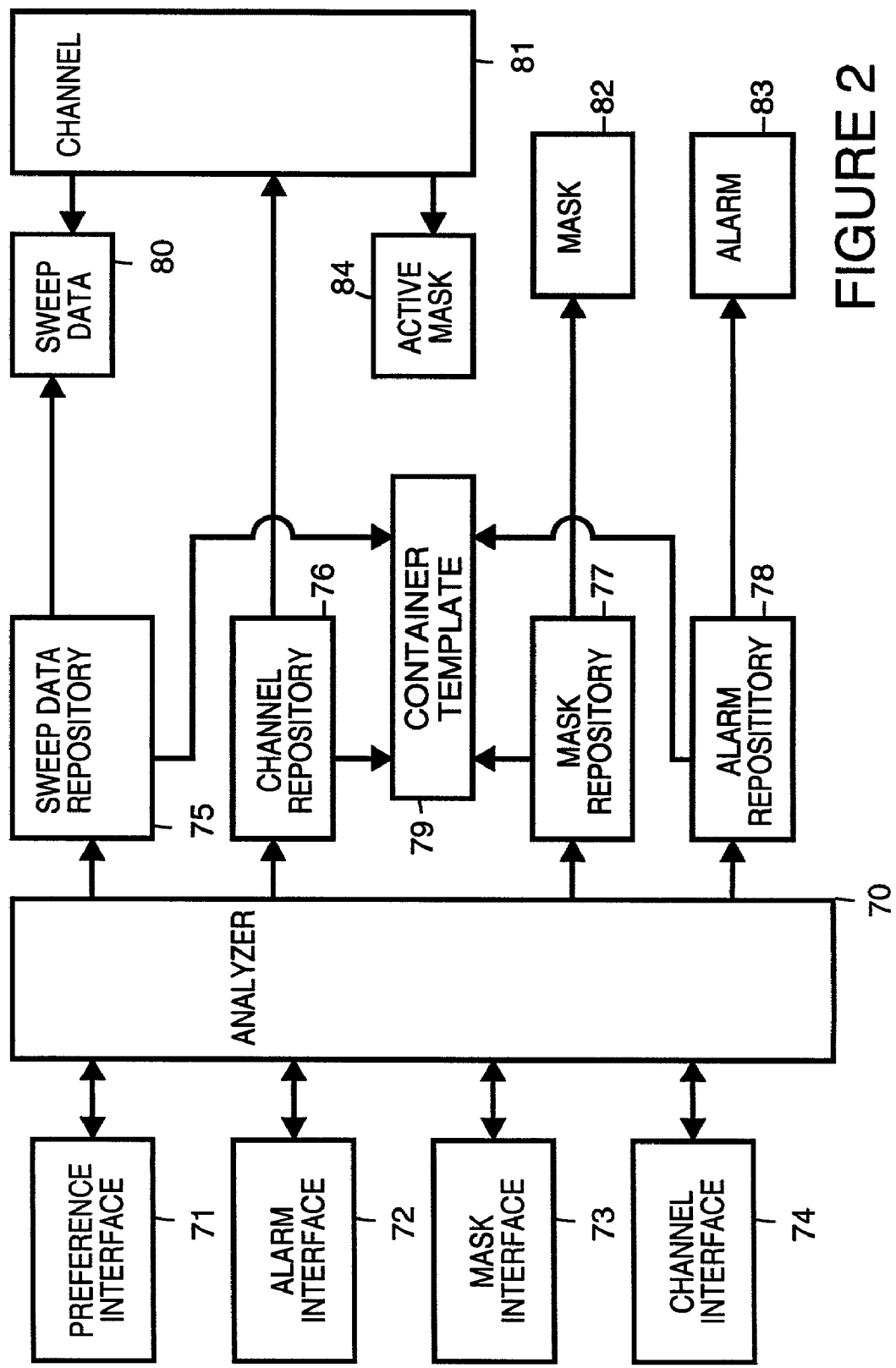
FIG. 2 is a block diagram that shows the organization of classes that implement signal analysis and the generation of a compliance mask in a channel analyzer instrument in accordance with a preferred embodiment of the present invention.

FIG. 2 is a block diagram that illustrates functionality within analyzer 15. Each block in FIG. 2 represents a class used to implement a particular feature within analyzer 15.

User preferences are communicated to analyzer 15 by way of a preference interface block, an alarm interface block, a mask interface block and a channel interface block. Preference interface block 71 includes methods that provide all get and set functionality for the analyzer. Alarm interface block 72 includes methods available for the alarm container. Mask interface block 73 includes methods available for the mask container. Channel interface 74 includes methods available for the channel container. The outside calling software can get access to the analyzer data with the help of standard template library (STL) iterators supported within most C++ compilers.

Analyzer block 70 includes analyze methods that take the input array as specified by methods within preferences interface block 71. Methods within the analyzer block 70 maintain or generate all channels from the input array.

Sweep data block 80 handles all data used to update a channel. The data is mainly extracted from the input array. Sweep data repository 75 provides a container for all sweep data.

Channel block 81 is the class for channels. A channel is a signal in the input spectrum which is defined mainly by frequency and power. The channel is updated using methods within channel block 81. Channel repository 76 provides a container for all channels.

Mask Repository 77 contains a mask for the whole frequency range. Parameters for the mask can be changed by a user (or by another software module) using mask interface block 73.

Mask block 82 is the class for masks. Active mask block 84 is the assigned frequency range for the channel. This information will be generated from mask repository 77.

Alarm block 83 is the class for alarms. Alarm repository 77 provides all violation information collected in time.

Container template 79 is the base class for each of the repositories. The base class for the repositories is based on STL container types. Suitable containers are list or vector. The base class contains basic methods for each repository.

Figure 3:
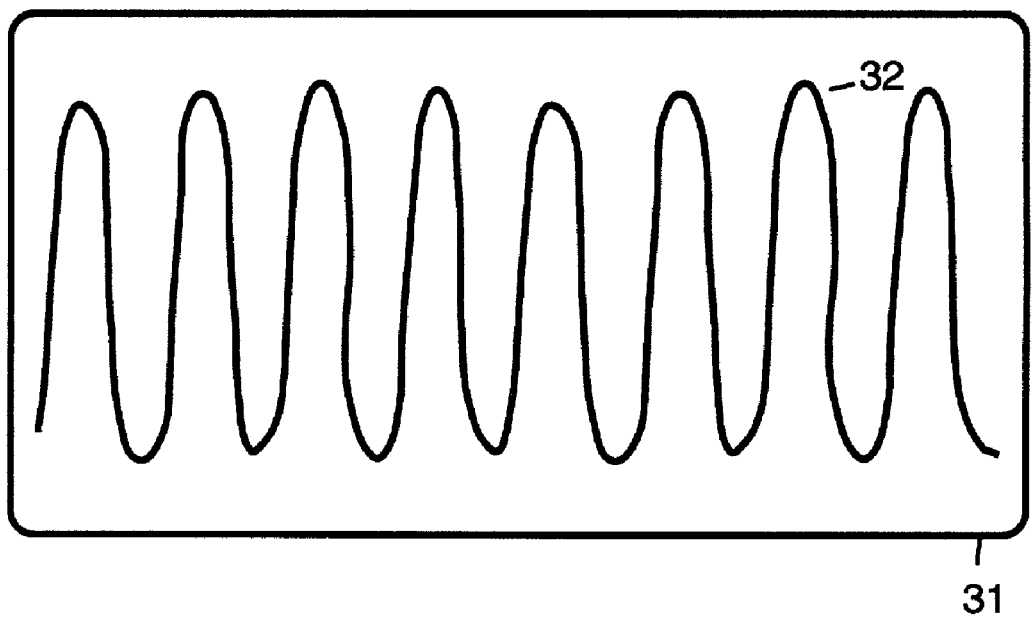
FIG. 3 shows the display of wavelength division multiplexing (WDM) system channels in a linear fashion across the display of a channel analyzer instrument in accordance with the prior art.

FIG. 3 shows a display 31 of a channel analyzer. Channel signals (represented by a trace 32) are displayed in a linear fashion. Alternatively, a tabular listing of the wavelengths and measurement results can be presented.

Figure 4:
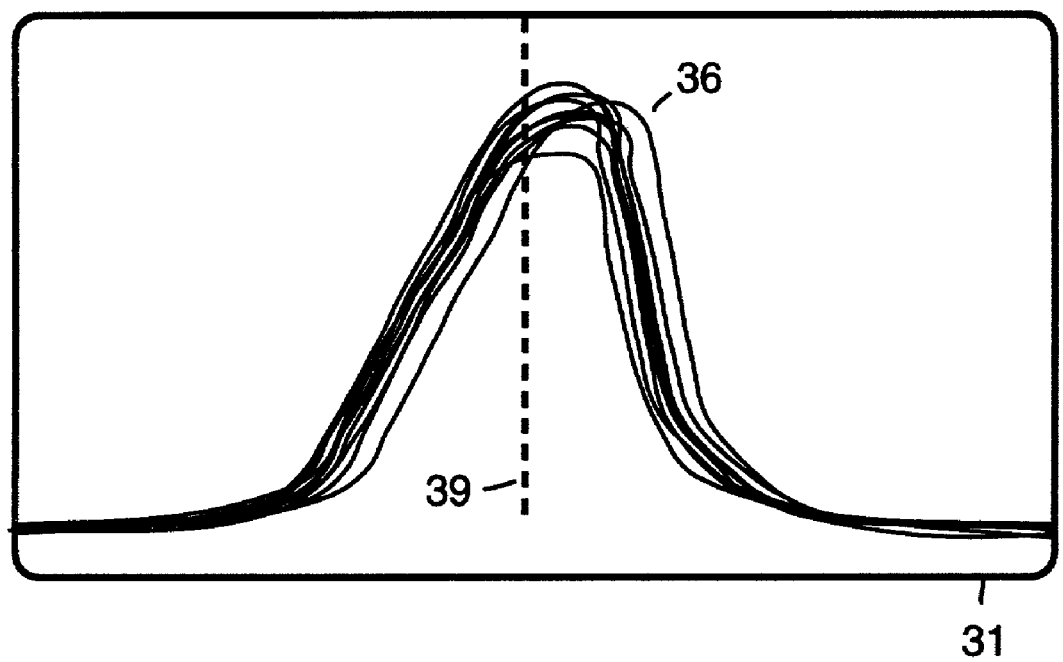
FIG. 4 shows the display of superimposed channels in accordance with a preferred embodiment of the present invention.

FIG. 4 shows display 31 with channel signals (represented by trace 36) being displayed superimposed upon one another relative to a central frequency of each channel. This display technique presents multiple channels super-imposed on the display, similar to the "eye diagram" used on Digital Communication Analyzers (DCA), and some oscilloscopes. The "center" of all channel signals are aligned to the x-axis position represented by a line 39. For example, the x-axis range is slightly more than the 1.5 times the center-to-center spacing of the signals. This allows the user to see the noise floor between adjacent channels, without having more than one effective channel displayed. The y-axis range shows the full amplitude range, from maximum channel peak to system noise floor.

The display of superimposed channels allows a user to very quickly and efficiently view a highly-populated WDM system. The user can view the super-position of all channels to measure overall system performance, any subset of channels for particular range performance, or "drill down" to quickly isolate and display a particular channel.

In a preferred embodiment of the present invention two additional capabilities are provided. For example, significant value to the user is added by providing access to the time-varying aspects of the superimposed signals. A single channel can be displayed with variable persistence of the trace. This show the statistical nature of the time-varying signals. Additionally, different colors can be used to show the probability statistics even more effectively. This can be applied to multiple signals.

Additionally a compliance mask can be overlayed on the channel signals. This allows test line limits and pass/fail criteria to be easily viewed. The user can easily view the variation of signals and how that variation compared with acceptable limits. Margins can be calculated and displayed. Failures to the mask criteria can be highlighted graphically and/or tabulated.

Figure 5:
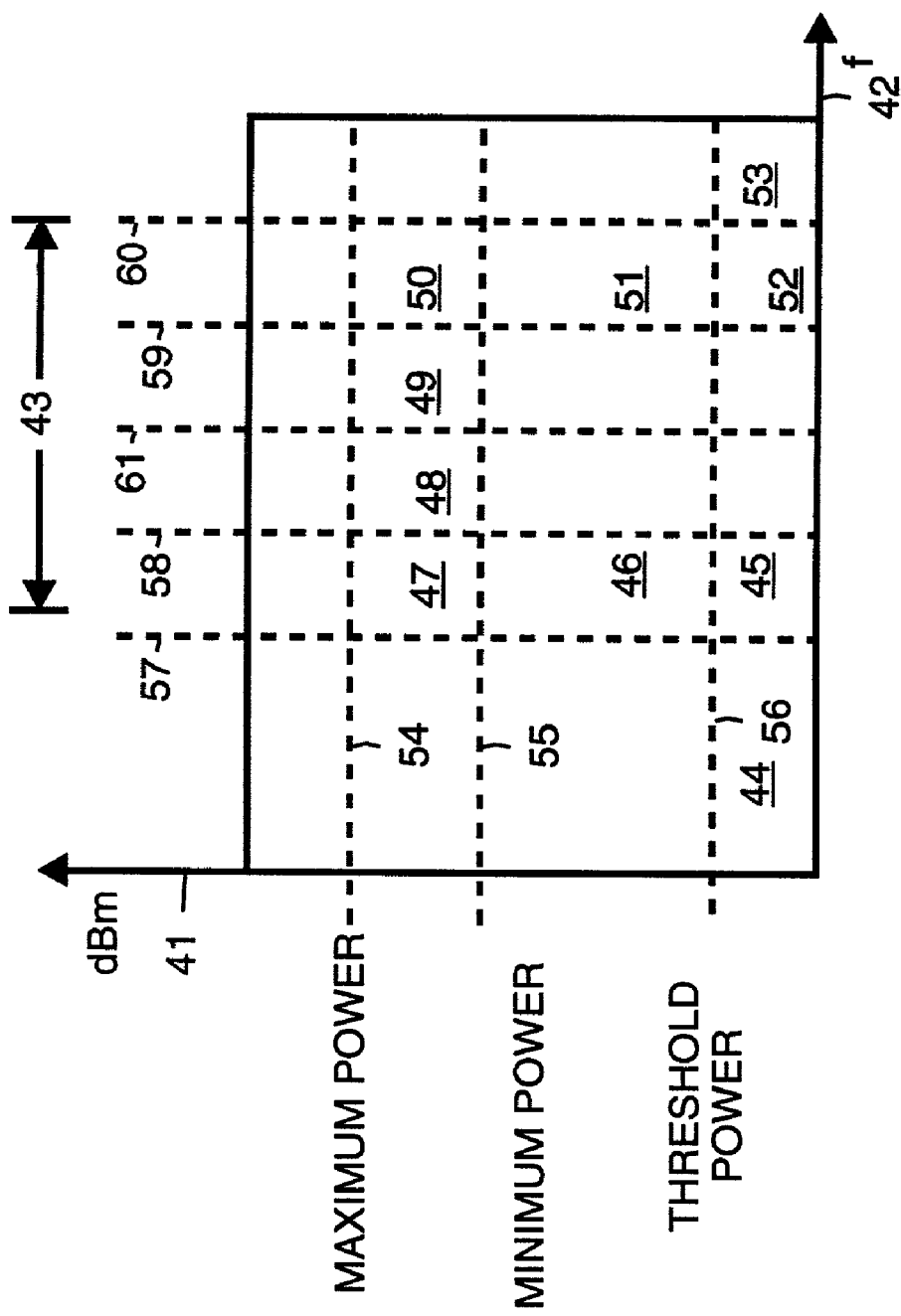
FIG. 5 shows a channel mask used to measure wavelength division multiplexing (WDM) transmission systems.

FIG. 5 illustrates channel parameters measured from the operation of laser signals in a WDM system. In FIG. 5 a horizontal axis 42 may indicate the frequency, and a vertical axis 41 may indicate signal power. Each channel includes a center frequency (wavelength) 61, a minimum frequency lower limit 57, a minimum frequency upper limit 58, a maximum frequency lower limit 59, and a maximum frequency upper limit 60, a minimum power 55 and a maximum power 54. A frequency range 43 of the channel extends between minimum frequency lower limit 57 and maximum frequency upper limit 60. A power threshold limit 56 indicates the maximum allowable power between channels.

Within the channel, several operating regions are defined. A region 44, a region 45, a region 46, a region 47, a region 48, a region 49, a region 50, a region 51, a region 52 and a region 53 are the acceptable operating regions. Detecting of a signal outside the acceptable operating regions 44 through 53 is considered a signal error and is brought to the user's attention graphically and/or using tabular methods.

The channel analyzer shown in FIG. 1 is used, for example, to characterize a comb of optical frequencies present in WDM optical transmission systems. The user of such a channel analyzer is typically interested in determining the frequencies, peak powers, and signal to noise ratios of the channel signals. Users are interested, for example, in instantaneous measurements or, in some cases, drift that occurs over an extended time.

The spectrum of channel signals can be displayed in a linear fashion across the display. The user can "scan" the x-axis of the display to look at a particular signal, or set of signals. The user can also narrow the field of view and "zoom in" on specific wavelengths.

Figure 6:
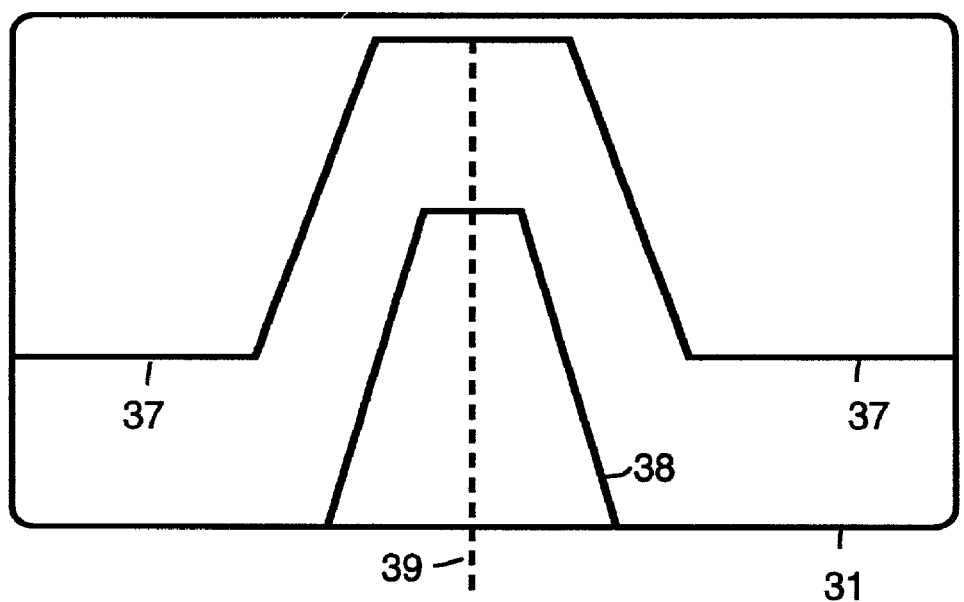
FIG. 6 shows an alternative embodiment of a channel mask used to measure wavelength division multiplexing (WDM) transmission systems.

FIG. 6 shows an example of compliance mask with another shape. A compliance mask portion 37 and a compliance mask portion 38 are displayed within display 31. Overlap of a signal within compliance mask 38 indicates violation of an amplitude minimum or frequency drift. Overlap of a signal within compliance mask 37 indicates violation of an amplitude maximum or frequency drift.

Figure 7:
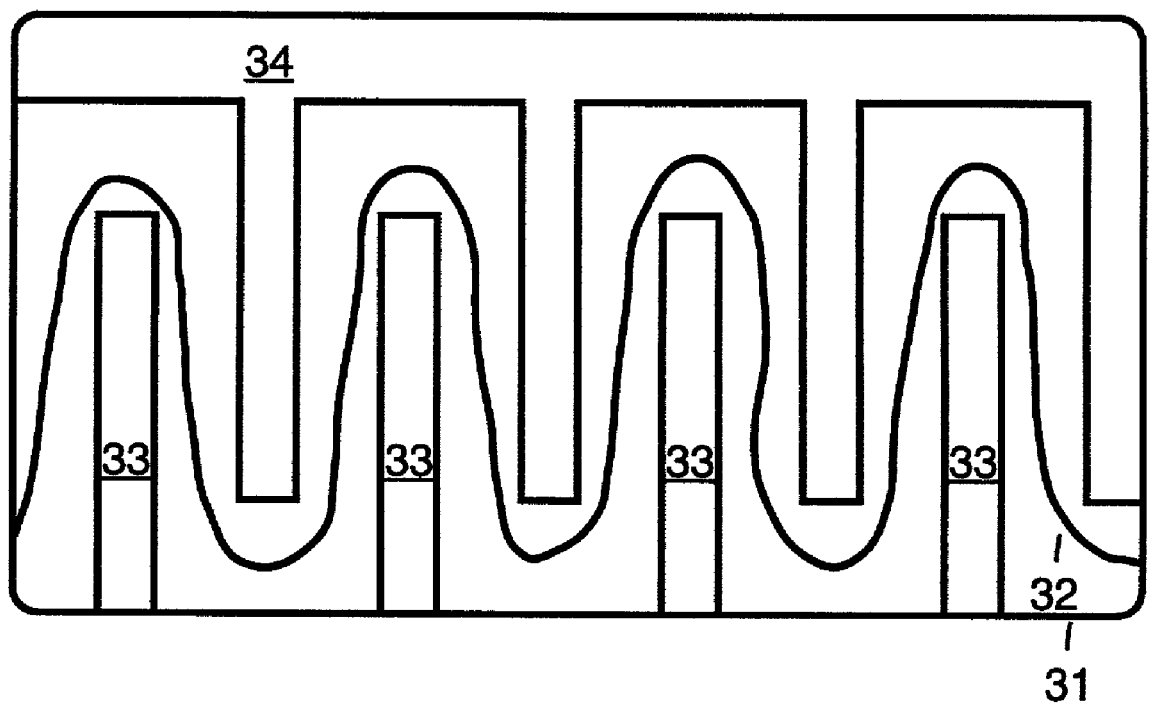
FIG. 7 shows the linear display of channels and compliance masks in accordance with a preferred embodiment of the present invention.

Compliance masks can also be displayed for each individual channel. For example, FIG. 7 shows mask segments 33 and mask segment 34 added to a linear display of multiple channels (e.g., signal 32). The user has specified the allowable channel parameters through a compliance mask and can view each channel performance with respect to those parameters. Channel spacing and allowable drift and as a result multiple mask segments 33 and mask segment 34 are displayed to a user.

Figure 8:
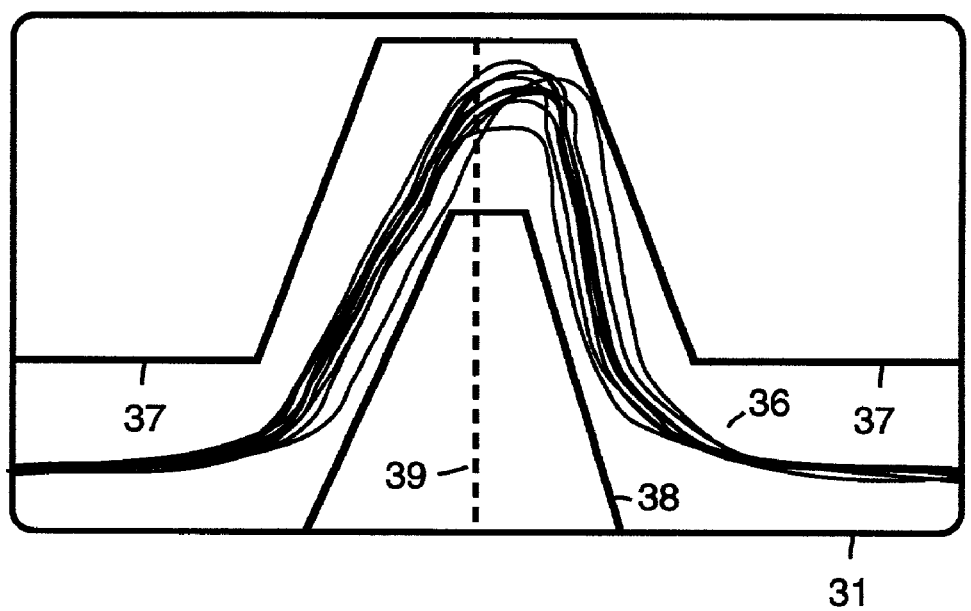
FIG. 8 shows the display of superimposed channels and a compliance mask in accordance with a preferred embodiment of the present invention.

FIG. 8 shows channel signals (represented by traces 36) being displayed superimposed upon one another relative to a central frequency of each channel. A single compliance mask, composed of compliance mask portion 37 and compliance mask portion 38, is overlayed with the superimposed channels in order to allow the user to easily view the performance of all signals to their acceptable performance parameter.

Mask margin (e.g., how close a signal trace comes to a mask) can be used as a tool to measure the quality of the signals. Mask hits also can be counted as a quality measure. Additionally, mask alignment can be performed automatically.

In a real-world situation the channels are not identically shaped. For example, some channels are higher or lower in amplitude and some channels are wider, some narrower. If 100 channels are displayed, all overlapped, a given pixel on display 31 could represent from one channel to 100 channels. To aid a user to determine how many channels are represented by a single pixel, a color grade approach is used to indicate the number of overlaps per displayed pixel.

Specifically, the color of each pixel on display 31 is determined by how many channels use that pixel on display 31 to display a representation of a signal for that channel. Points on display 31 commonly used to display numerous channels over time (accumulating hits over time) change color to represent a higher hit count. For this overlapping color grade approach, when the channels are static, the display colors remain static over time. The colors indicate the "depth" of the displayed channels (degree of overlap). For example, Table 1 below represents a color for a hit counts for an application where channel signals are static.

TABLE 1

| Hit Count | Color |
|---|---|
| 1 | Yellow |
| 2–5 | Green |
| 6–20 | Blue |
| 21–50 | Purple |
| 51–100 | Red |

Table 1 gives just one color scheme. An unlimited number of different color schemes could be used as well. For example, more color shades can be used to more precisely indicate the number of hits. In another variation, a grayscale can be used where pixels are different shades of gray are used. For example, each pixel used by at least one channel is colored a shade of gray from dark gray through white. For example, white represents the highest number of hits.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for graphically presenting multiple signals, comprising the following step:
    (a) separately representing on a display a signal for each measured frequency channel, including the following substep:
        (a.1) superimposing representations of the signals, including the following substeps:
            (a.1.1) aligning center channel frequencies for all the representations of the signals relative to a single position on a first axis, and
            (a.1.2) indicating, for all the representations of the signals, amplitude relative to a second axis.

2. A method as in claim 1 additionally comprising the following step:
    (b) displaying a line, intersecting the single position on the first axis, that indicates the center channel frequency for all the representations of the signals.

3. A method as in claim 1 additionally comprising the following step:
    (b) displaying a mask that indicates when values for the signals are outside channel frequency limits and that indicates when values for the signals are outside channel amplitude limits.

4. A method as in claim 1 additionally comprising the following steps:
    (b) displaying a mask that indicates when values for the signals are outside channel frequency limits and that indicates when values for the signals are outside channel amplitude limits; and,
    (c) using margin from the mask as a tool to measure the quality of signals.

5. A method as in claim 1 additionally comprising the following steps:
    (b) displaying a mask that indicates when values for the signals are outside channel frequency limits and that indicates when values for the signals are outside channel amplitude limits; and,
    (c) counting mask hits as a tool to measure the quality of signals.

6. A method as in claim 1 wherein substep (a.1) additionally includes the following substep:
    (a.1.3) using pixel color to indicate how many representations of the signals overlap each pixel.

7. A method as in claim 1 wherein substep (a.1) additionally includes the following substep:
    (a.1.3) using shades of gray to indicate how many representations of the signals overlap each pixel.

8. A method as in claim 1 wherein substep (a.1) additionally includes the following substep:
    (a.1.3) using shades of color to indicate how many representations of the signals overlap each pixel.

9. An instrument that measures multiple signals, comprising:
    a display; and,
    an analyzer that separately represents on the display a signal for each measured frequency channel, wherein representations of the signals are superimposed so that center channel frequencies for all the representations of the signals are aligned relative to a single position on a first axis, and so that for all the representations of the signals, amplitude is indicated relative to a second axis.

10. An instrument as in claim 9 wherein the analyzer additionally represents on the display a line intersecting the single position on the first axis, the line indicating the center channel frequency for all the representations of the signals.

11. An instrument as in claim 9 wherein the analyzer additionally represents on the display a mask that indicates when values for the signals are outside channel frequency limits and that indicates when values for the signals are outside channel amplitude limits.

12. An instrument as in claim 9 wherein the analyzer additionally represents on the display a mask that indicates when values for the signals are outside channel frequency limits and that indicates when values for the signals are outside channel amplitude limits, margins from the mask being used as a tool to measure the quality of signals.

13. An instrument as in claim 9 wherein the analyzer additionally represents on the display a mask that indicates when values for the signals are outside channel frequency limits and that indicates when values for the signals are outside channel amplitude limits, mask hits being counted as a tool to measure the quality of signals.

14. An instrument as in claim 9 wherein pixel color on the display indicates how many representations of the signals overlap each pixel.

15. An instrument as in claim 9 wherein shades of gray of pixels on the display indicate how many representations of the signals overlap each pixel.

16. An instrument as in claim 9 wherein shades of color to indicate how many representations of the signals overlap each pixel.

17. A method for measuring multiple signals, comprising the following steps:
   (a) representing on a display a signal for each measured frequency channel; and,
   (b) displaying masks that indicate when values for the signals are outside channel frequency limits, wherein the displayed masks also indicate when values for the signals are outside channel amplitude limits.

18. A method for measuring multiple signals, comprising the following steps:
   (a) representing on a display a signal for each measured frequency channel;
   (b) displaying masks that indicate when values for the signals are outside channel frequency limits; and
   (c) determining mask margin by calculating distance of the signals to the mask; and using the mask margin as a tool to measure the quality of signals.

19. A method as in claim 17 additionally comprising the following step:
   (c) counting mask hits as a tool to measure the quality of signals.

20. A method as in claim 18 additionally comprising the following step:
   (c) counting mask hits as a tool to measure the quality of signals.

* * * * *